(12) United States Patent
Liu

(10) Patent No.: US 6,903,628 B2
(45) Date of Patent: Jun. 7, 2005

(54) LOWPASS FILTER FORMED IN MULTI-LAYER CERAMIC

(75) Inventor: Chien-Chang Liu, Taipei (TW)

(73) Assignee: Chi Mei Communication Systems, Inc., Tainan (TW)

( * ) Notice: Subject to any disclaimer, the term of this patent is extended or adjusted under 35 U.S.C. 154(b) by 75 days.

(21) Appl. No.: 10/604,408

(22) Filed: Jul. 18, 2003

(65) Prior Publication Data

US 2005/0012567 A1 Jan. 20, 2005

(51) Int. Cl.⁷ .............................................. H03H 7/00
(52) U.S. Cl. ................................. 333/170; 333/167
(58) Field of Search ............................. 333/185, 167, 333/170

(56) References Cited

U.S. PATENT DOCUMENTS 5,331,505 A * 7/1994 Wilheim .................. 361/306.3
6,791,434 B2 * 9/2004 Tsujiguchi .................. 333/172

* cited by examiner

Primary Examiner—Don Le

(57) ABSTRACT

A laminated lowpass filter includes nine dielectric substrates arranged in a stack. The outer surfaces of the stack are ground planes. From top to bottom, top four layers forms a first MIM capacitor, a spiral four-port "mutually coupled coils" (MCCs) structure is placed in the middle, and then the second MIM capacitor is formed on bottom four layers. The first port (P1") of the MCCs is connected to the first MIM capacitor. The fourth port (P4") of the MCCs is connected to the second MIM capacitor. The second and third ports (P2", P3") constitute input and output of the laminated lowpass filter on the sides of the stack.

7 Claims, 10 Drawing Sheets

LOWPASS FILTER FORMED IN MULTI-LAYER CERAMIC

BACKGROUND OF INVENTION

1. Field of the Invention

The present invention relates to a multi-layer ceramic lowpass filter particularly for use in a wireless communication terminal such as a portable phone or RF module.

2. Description of the Prior Art

The trends of wireless communication terminal are power saving and miniaturization. To correspond to those trends, a miniaturized lowpass filter with high performance is required.

FIG. 1 is a conventional lowpass filter 8, with its equivalent circuit shown in FIG. 2. The filter 8 comprises an inductor 4 and two capacitors 3, 5. The drawback of this filter 8 is that the capacitors 3, 5 in this filter 8 usually have a large value, especially for low frequency applications. As a result, it is impractical to implement a miniaturized lowpass filter by adopting this type of configuration.

FIG. 3 is another conventional lowpass filter 10, with its equivalent circuit shown in FIG. 4. The lowpass filter comprises inductors 13, 14, 15 and capacitors 16, 17. Branches of a serial inductor and capacitor contribute to an attenuation pole, which improves spurious response in higher frequency range. Due to the serial inductors 13, 15 the capacitors 16, 17 for this kind of filter 10 usually have much smaller value than those required in the filter 8 shown in FIG. 1. However, implementing the filter 10 in uniplanar form is still too large from the view of a mobile device.

SUMMARY OF INVENTION

It is therefore a primary objective of the claimed invention to provide a miniaturized lowpass filter with very wide rejection bandwidth by taking advantage of a multi-layer structure.

The claimed invention filter is formed by lumped capacitors and mutually coupled coils (MCCs) in spiral form. The lumped capacitor is formed in a metal-insulation-metal (MIM) configuration. A novel stack structure of "mutually coupled coils" is introduced in the claimed invention. The merits of such stack configuration are size shrinkage and loss reduction by maximizing the magnetic coupling between coils. The benefit of size shrinkage is not only for the cost issue but also for the fact that better stopband performance can be achieved due to higher geometric resonance.

DETAILED DESCRIPTION

Figure 1:
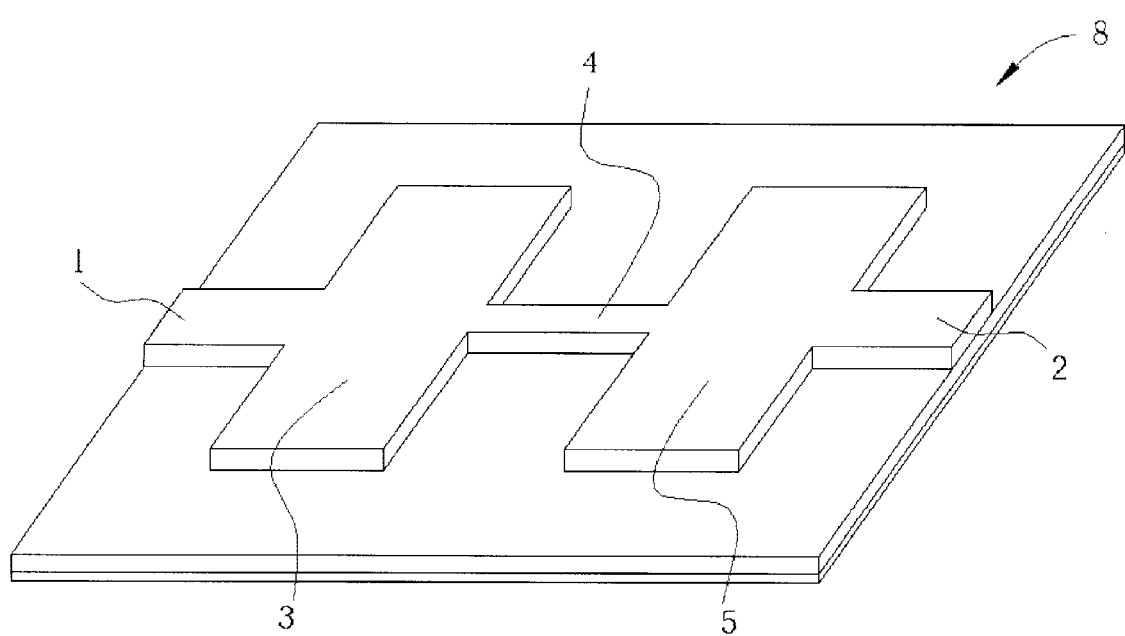
FIG. 1 is a perspective view of a conventional high frequency lowpass filter.
Figure 2:
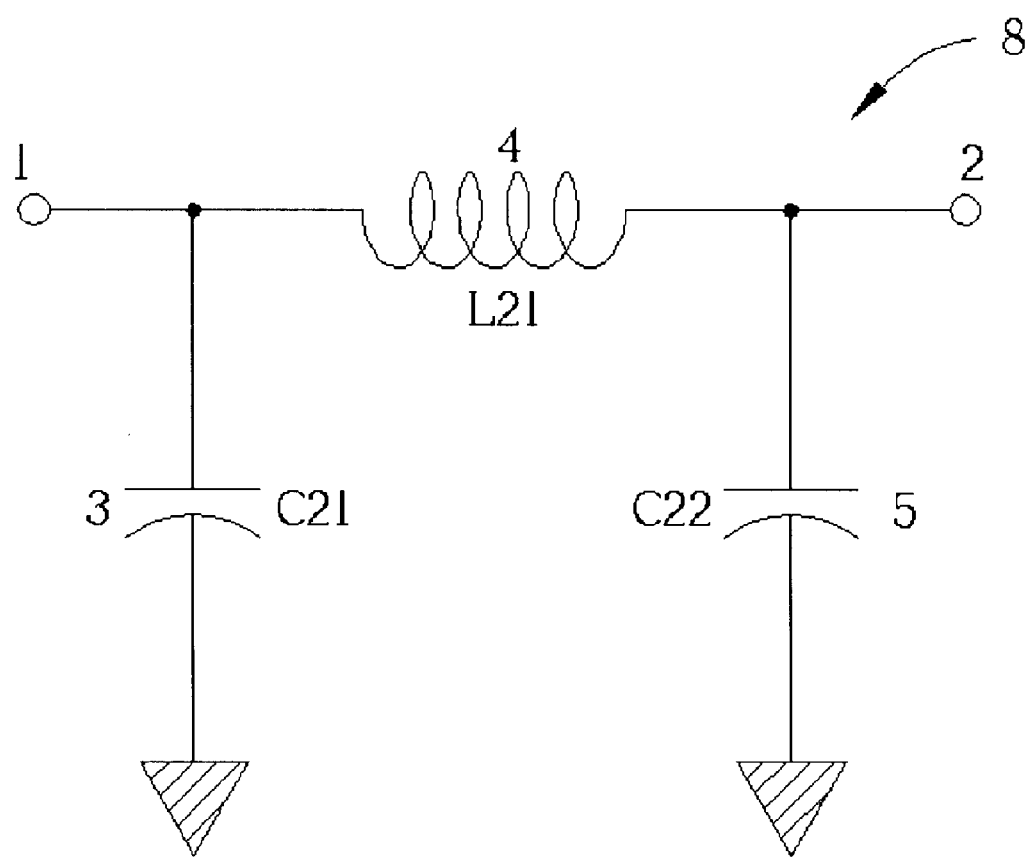
FIG. 2 is an equivalent circuit of the conventional high frequency lowpass filter of FIG. 1.
Figure 3:
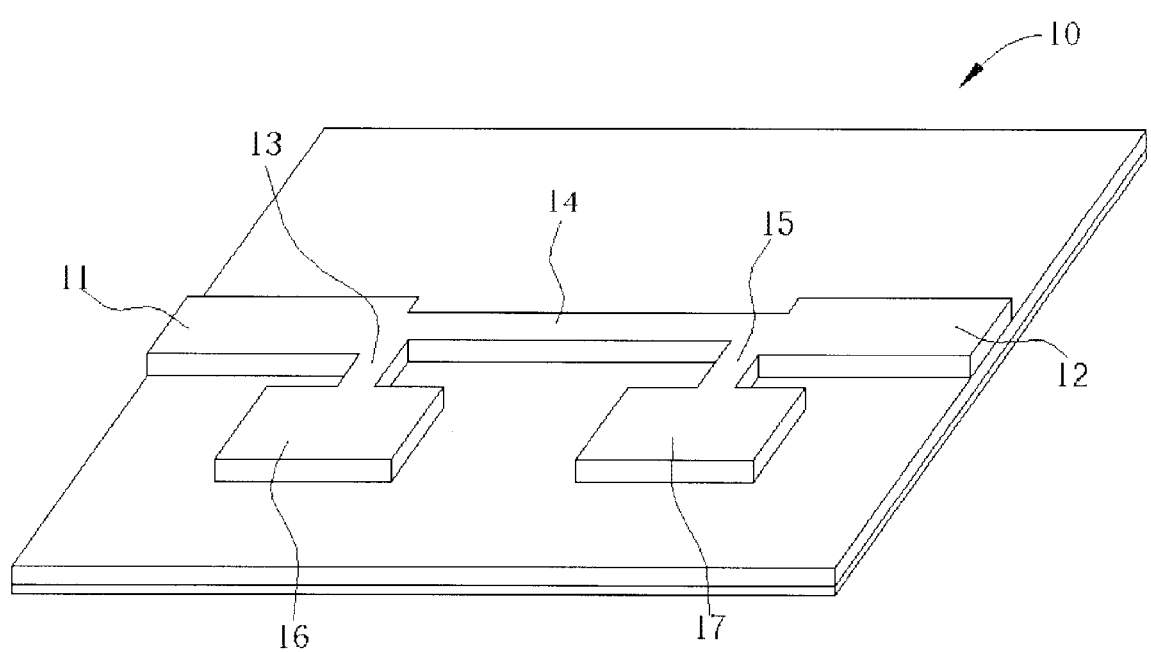
FIG. 3 is a perspective view of another example of a conventional high frequency lowpass filter.
Figure 4:
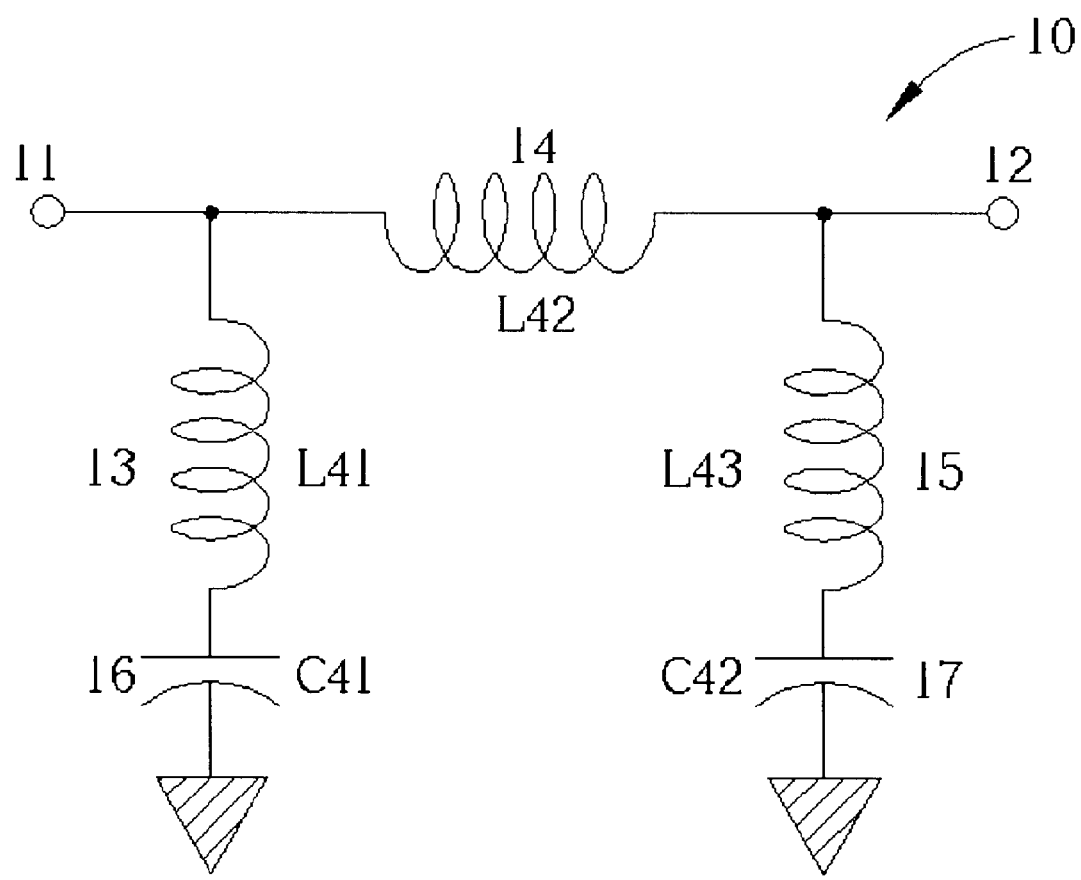
FIG. 4 is an equivalent circuit of the conventional high frequency lowpass filter of FIG. 3.
Figure 5:
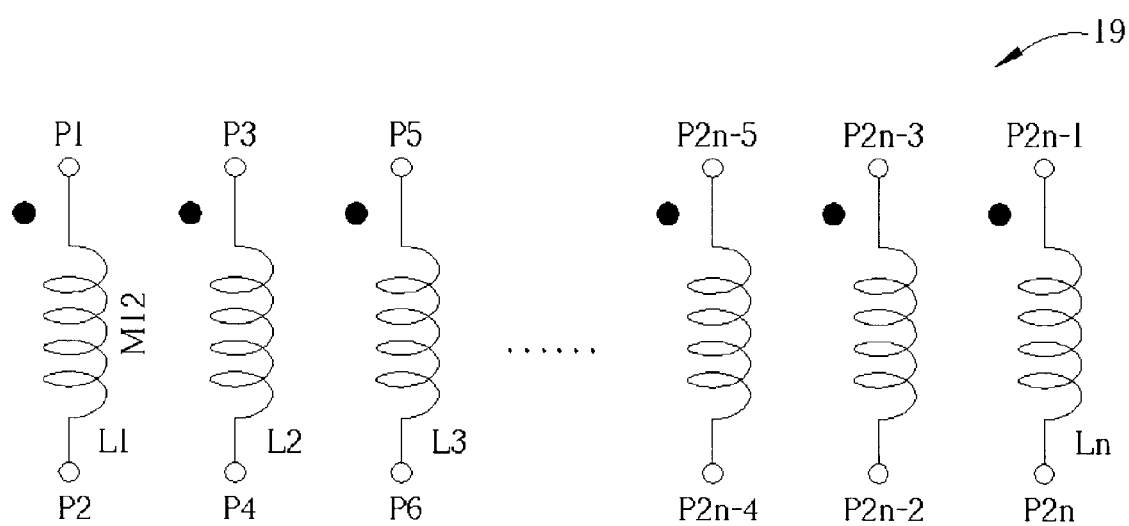
FIG. 5 is a generalized equivalent circuit of mutually coupled coils (MCCs).

A generalized equivalent circuit of mutually coupled coils is shown in FIG. 5. In the claimed invention, a four-port MCCs structure 19 is shown with n=3, where port 2 is connected to port 3 and port 4 is connected to port 5.

Figure 6:
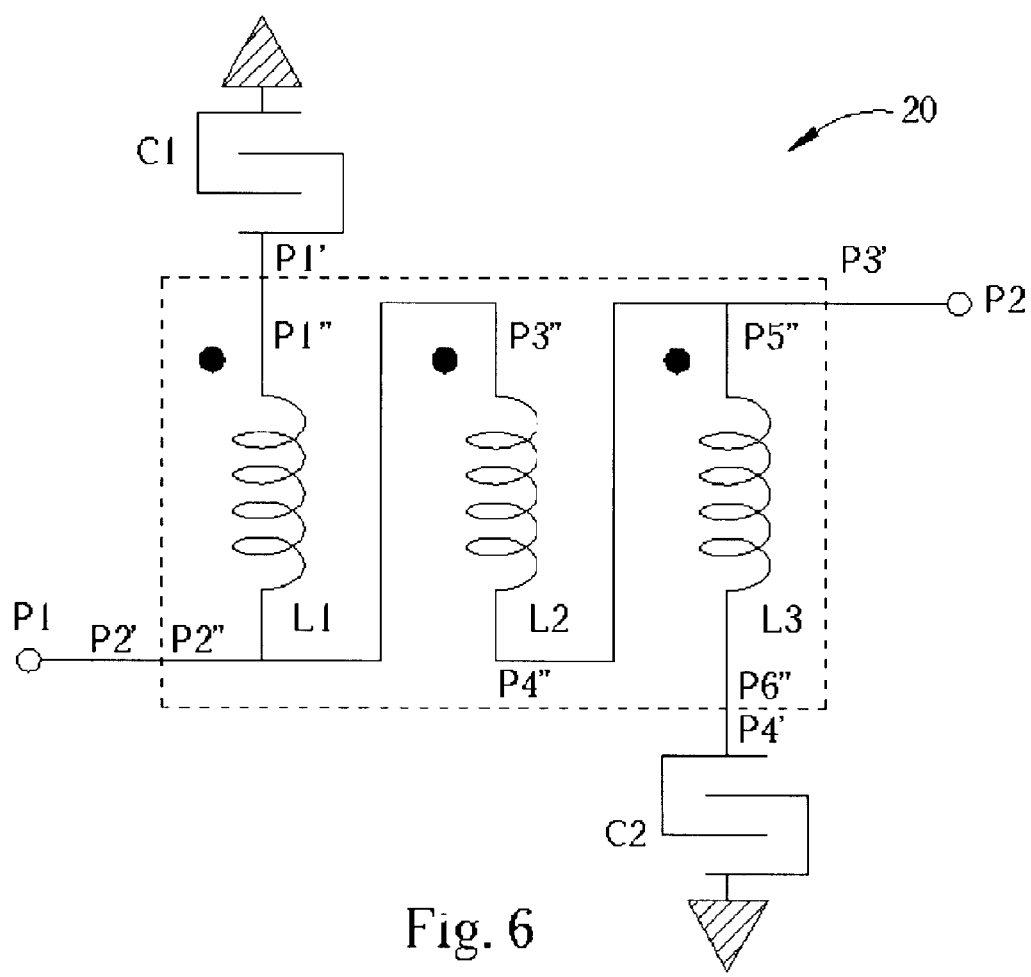
FIG. 6 is an equivalent circuit of the present invention.
Figure 7:
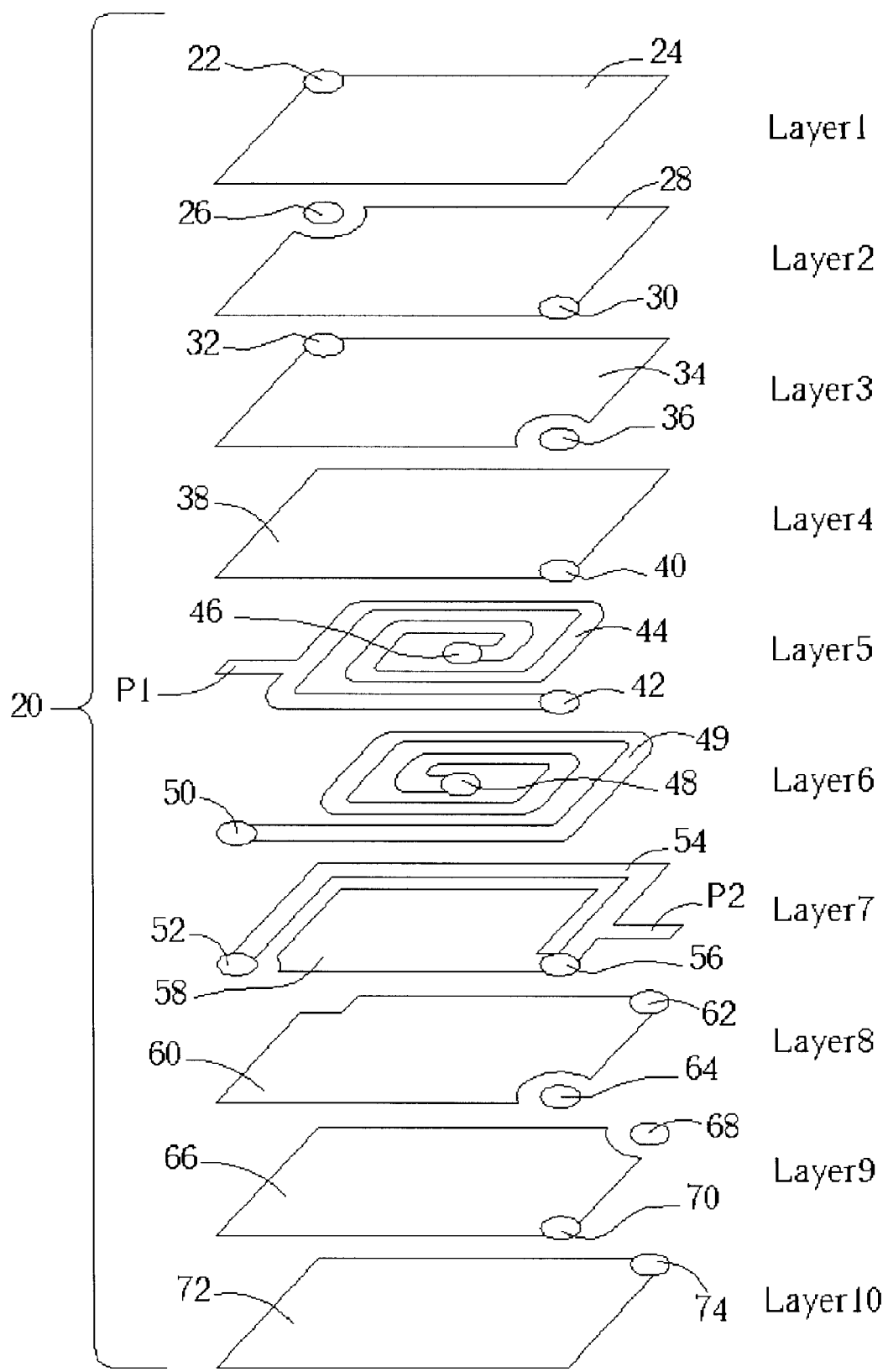
FIG. 7 is an exploded diagram of a multi-layered ceramic substrate that is used to form a lowpass filter according to the present invention.
Figure 8:
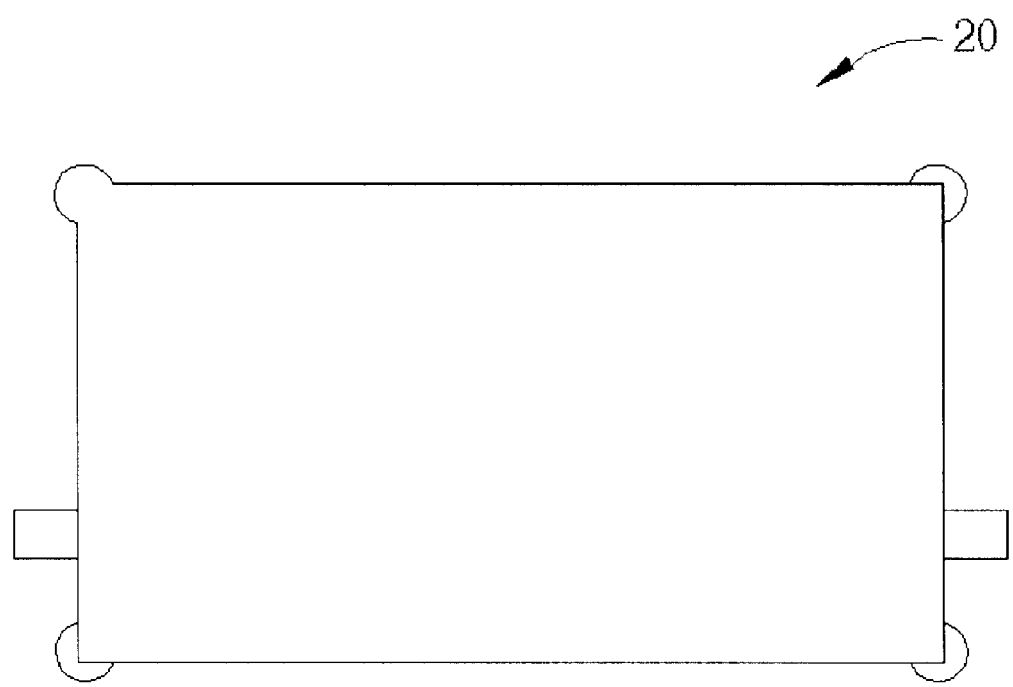
FIG. 8 through FIG. 10 respectively show three-dimensional top, perspective, and side views of the present invention lowpass filter implemented with LTCC technology.
Figure 9:
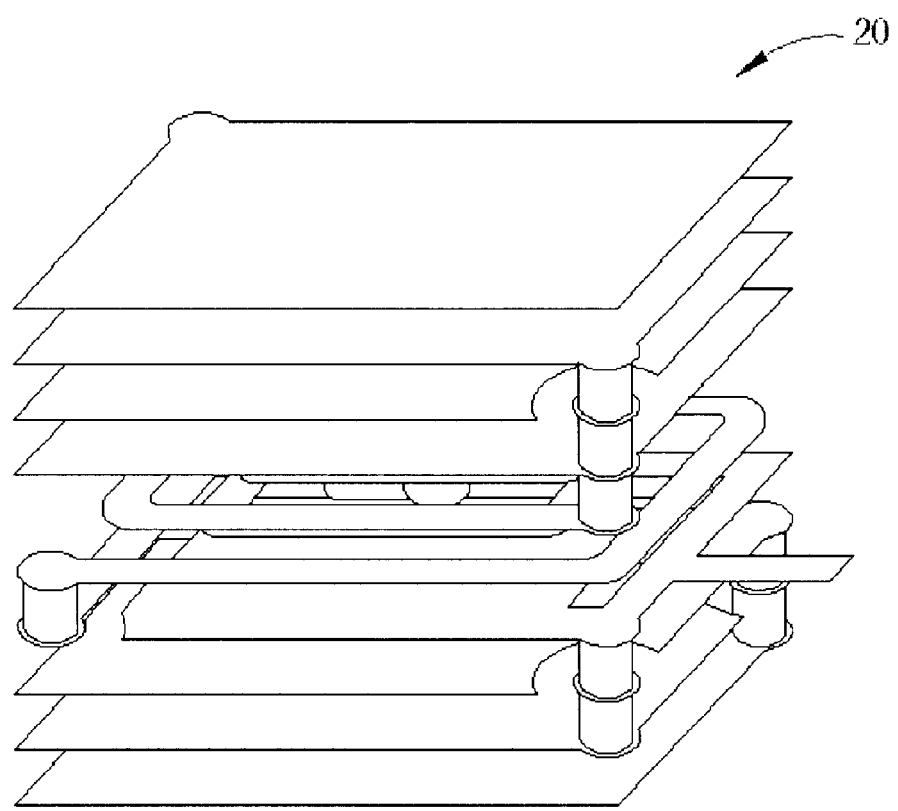
Figure 10:
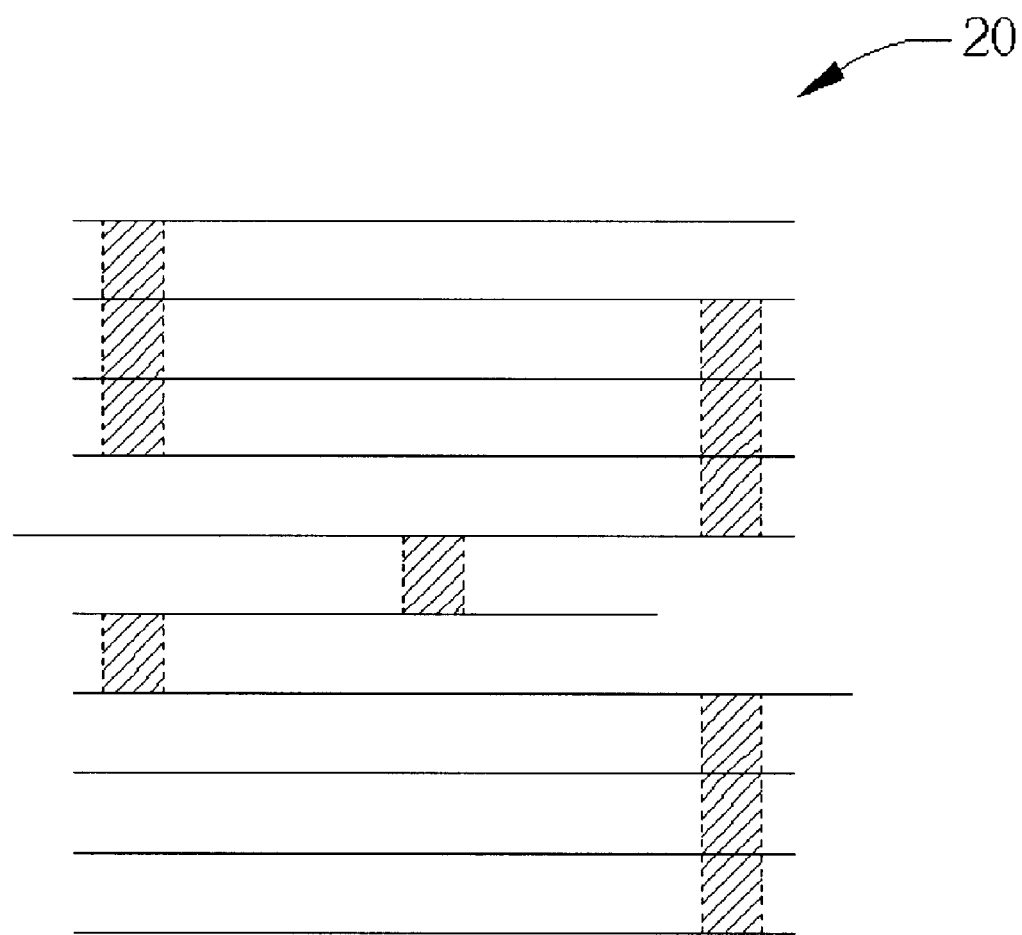

The present invention lowpass filter is preferably formed in a multi-layered ceramic substrate such as a low temperature co-fired ceramic (LTCC) substrate. Please refer to FIG. 6 through FIG. 10. FIG. 6 is an equivalent circuit of a lowpass filter 20 according to the present invention. The lowpass filter 20 comprises coils L1, L2, L3, capacitors C1, C2, and ports P1 and P2. FIG. 7 is an exploded diagram of a multi-layered ceramic substrate that is used to form the lowpass filter 20. FIG. 8 through FIG. 10 respectively show three-dimensional top, perspective, and side views of the present invention lowpass filter 20 implemented with LTCC technology.

In FIG. 7, the multi-layered ceramic substrate has ten layers, labeled layer 1 to layer 10. Layers 1–4 form MIM capacitor C1, layers 5–7 form so called "mutually coupled coils" (consisting of L1, L2, and L3) and layers 7–10 form MIM capacitor C2. For clarity, a description of the 10 layers of the multi-layered ceramic substrate of the lowpass filter 20 will be given.

Layer 1 includes a contact node 22 and a conductive sheet 24. Layer 2 includes contact nodes 26 and 30 and a conductive sheet 28. Layer 3 includes contact nodes 32 and 36 and a conductive sheet 34. Layer 4 includes a contact node 40 and a conductive sheet 38. Contact nodes are used for connecting one layer of the ceramic substrate to another layer through vertical vias. For example, contact node 22 is connected to contact nodes 26 and 32. This serves the purpose of connecting conductive sheet 24 to conductive sheet 34. Notice that contact node 26 is not electrically connected to conductive sheet 28. Therefore, sheet 28 does not electrically connect to sheet 24 and 34. Likewise, contact node 30 is connected to contact nodes 36 and 40, thus connecting conductive sheets 28 and 38. As said above, layers 1–4 form capacitor C1. Specifically, conductive sheets 24 and 34 form one conductor of the capacitor C1, and conductive sheets 28 and 38 form another conductor of the capacitor C1.

Layer 5 contains an inductive strip 44. The inductive strip 44 has contact nodes 42 and 46 and also contains port P1, which was shown in FIG. 6. Coil L1 is formed between contact node 42 and port P1. Contact node 42 of layer 5 connects to contact node 40 of layer 4 to connect coil L1 to capacitor C1. Layer 6 has an inductive strip 49 with contact nodes 48 and 50. Contact node 46 connects to contact node 48 to connect layer 5 to layer 6. Layer 7 has an inductive strip 54 with contact nodes 52 and 56 and port P2. Contact node 50 connects to contact node 52 to connect layer 6 to layer 7. Coil L2 is formed between input port P1 and output port P2, and coil L3 is formed between port P2 and contact node 56. Finally, coil L3 is connected to capacitor C2 at contact node 56. In the present invention, all inductive strips 44, 49, and 54 are realized in spiral form.

Similar to capacitor C1, capacitor C2 is formed out of four conductive sheets 58, 60, 66, and 72. Conductive sheets 58 and 66 are connected by contact nodes 56, 64, and 70. Likewise, conductive sheets 60 and 72 are connected by contact nodes 62, 68, and 74. Thus, layers 7–10 form capacitor C2. Specifically, conductive sheets 58 and 66 form one conductor of the capacitor C2, and conductive sheets 60 and 72 form another conductor of the capacitor C2. In order to shield the lowpass filter 20 from external interference, conductive sheets 24 and 72 in layer 1 and layer 10 are grounded in order to provide a protective ground layer.

Because coils L1, L2, and L3 are connected together in series without any grounding layer separating them, mutual inductance will affect effective inductance values of L1, L2, and L3. Therefore, $L1_{eff}=L1+M12+M13$, $L2_{eff}=L2+M12+M23$, and $L3_{eff}=L3+M13+M23$. With careful calculation, effective inductances of coils L1, L2, and L3 can be designed to equal desired inductance values. In other words, with the present invention, coils L1, L2, and L3 can be made smaller than prior art inductors with identical effective inductances. For example, suppose that in the prior art lowpass filter 10, an inductance of L1" was needed. In the present invention $L1_{eff}=L1"$, and $L1_{eff}=L1+M12+M13$. Therefore, L1 has a lower inductance value than L1" and can be created using less area on the multi-layered ceramic substrate of the lowpass filter 20.

Compared to the prior art, the lowpass filter of the present invention has two main advantages. First, smaller inductors can be used. This allows for less area to be used in the multi-layered ceramic substrate to form inductors as well as lower conductor loss. In addition, no grounding layers are needed between inductors, allowing for simpler design of the lowpass filter.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A lowpass filter formed in a multi-layered substrate comprising:
   a first MIM capacitor formed on at least two layers of the multi-layered substrate;
   at least a mutually coupled coils (MCCs) structure comprising three coils, a first coil being electrically connected to the first MIM capacitor in series, and a second coil being connected between first coil and a third coil; and
   a second MIM capacitor formed on at least two layers of the multi-layered substrate and electrically connected to the third coil in series.

2. The lowpass filter of claim 1 wherein a top layer of the first lumped capacitor and a bottom layer of the second lumped capacitor are grounding layers for shielding the lowpass filter from external interference.

3. The lowpass filter of claim 1 wherein the multi-layered substrate is a low temperature co-fired ceramic (LTCC) substrate.

4. The lowpass filter of claim 1 wherein the MCCs structure is realized in spiral form.

5. The lowpass filter of claim 4 wherein the spiral MCCs structure is arranged in a stacked configuration.

6. The lowpass filter of claim 4 wherein the spiral MCCs structure is a four-port element.

7. The lowpass filter of claim 4 wherein the rotation direction of the spiral MCCs structure can be clockwise or counterclockwise.

* * * * *